United States Patent
Zawoy et al.

(10) Patent No.: US 9,035,497 B2
(45) Date of Patent: May 19, 2015

(54) METHOD AND APPARATUS FOR PROVIDING AN ELECTRICAL ENERGY SYSTEM

(75) Inventors: Karl Zawoy, High Springs, FL (US); David Patrick Arnold, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 1182 days.

(21) Appl. No.: 12/892,195

(22) Filed: Sep. 28, 2010

(65) Prior Publication Data

US 2011/0233932 A1    Sep. 29, 2011

Related U.S. Application Data

(60) Provisional application No. 61/247,217, filed on Sep. 30, 2009.

(51) Int. Cl.
| | |
|---|---|
| *H02J 1/00* | (2006.01) |
| *H01M 16/00* | (2006.01) |
| *H01L 35/00* | (2006.01) |
| *H01M 10/0525* | (2010.01) |

(52) U.S. Cl.
CPC ............... *H01M 16/00* (2013.01); *H01L 35/00* (2013.01); *H01M 10/0525* (2013.01)

(58) Field of Classification Search
USPC ........ 307/26, 48, 72, 100, 126, 140; 320/101, 320/114, 128
See application file for complete search history.

(56) References Cited

U.S. PATENT DOCUMENTS

| | | | |
|---|---|---|---|
| 5,532,573 A | 7/1996 | Brown et al. | |
| 6,703,722 B2 * | 3/2004 | Christensen | 307/71 |
| 7,075,194 B2 | 7/2006 | Weidenheimer et al. | |
| 7,604,507 B1 * | 10/2009 | Millon | 439/627 |
| 2007/0062744 A1 | 3/2007 | Weidenheimer et al. | |
| 2007/0182362 A1* | 8/2007 | Trainor et al. | 320/101 |
| 2009/0174361 A1* | 7/2009 | Duron et al. | 320/101 |

FOREIGN PATENT DOCUMENTS

| | | |
|---|---|---|
| WO | WO-2009-045660 A1 | 4/2009 |
| WO | WO 2009/051870 A1 * | 4/2009 |
| WO | WO-2009-051870 A1 | 4/2009 |

OTHER PUBLICATIONS

Raghunathan, V., et al., "Design Considerations for Solar Energy Harvesting Wireless Embedded Systems," Fourth International Symposium on Information Processing in Sensor Networks, Apr. 2005, pp. 457-462.

* cited by examiner

*Primary Examiner* — Rexford Barnie
*Assistant Examiner* — Xuan Ly
(74) *Attorney, Agent, or Firm* — Saliwanchik, Lloyd & Eisenchenk

(57) ABSTRACT

Embodiments of the subject invention relate to a method and apparatus for providing an electrical energy system. A specific embodiment can incorporate at least one energy harvesting module (H-module), at least one energy storage module (S-module), and at least one power electronic circuit module (C-module). The various modules can be integrated into a standard battery configuration. Specific embodiments pertain to a reconfigurable energy system with modules that can be disconnected and reconnected into different shapes and configurations.

50 Claims, 4 Drawing Sheets

| C | C | C | C |
|---|---|---|---|
| S | S | S | S |
| S | S | S | S |
| S | S | S | S |
| S | S | S | S |
| H | H | H | H |

FIG. 4A

| C | C | C | C |
|---|---|---|---|
| S | S | S | S |
| H | H | H | H |
| H | H | H | H |
| H | H | H | H |
| H | H | H | H |

FIG. 4B

METHOD AND APPARATUS FOR PROVIDING AN ELECTRICAL ENERGY SYSTEM

CROSS-REFERENCE TO RELATED APPLICATION

The present application claims the benefit of U.S. Provisional Application Ser. No. 61/247,217, filed Sep. 30, 2009, which is hereby incorporated by reference herein in its entirety, including any figures, tables, or drawings.

BACKGROUND OF INVENTION

Energy harvesting systems that collect solar, vibrational, thermal or other energy from the ambient environment are very attractive for powering consumer electronic devices such as mobile phones, media players, and toys. Electrochemical batteries have provided sufficiently high power densities to support the electronic devices, but these batteries require periodic recharging and/or replacement. Various energy harvesting systems have been proposed to augment or replace conventional batteries.

A typical energy harvesting system incorporates at least one energy harvester for converting ambient energy into electrical energy. Typically energy harvesting systems can also, optionally, incorporate at least one power electronic circuit for power management. Further typical energy harvesting systems can also, optionally, incorporate at least one energy storage device (e.g., rechargeable battery). There is much research and development on various mechanisms for energy capture, storage, and delivery.

However, with respect to energy harvesting there is not typically a "one-size-fits-all" solution. Different electronic devices are often used differently (e.g., indoors vs. outdoors) and under different motional and environmental conditions. Additionally, different electronic devices have different power demands, both in the average power consumption and peak power needs. Even more so, the same electronic device, e.g., a mobile phone, may be used very differently by different types of users and/or in different circumstances. For example, a business executive may be expected to use a mobile phone much more heavily as compared to a retiree. These details are important when considering any supportive energy harvesting technology. An energy harvesting system should preferably be tailored for a specific product, and even more so, it may be desirable to be able to tailor an energy harvesting system for specific user profiles and/or to specific use profiles.

BRIEF SUMMARY

Embodiments of the subject invention relate to a method and apparatus for providing an electrical energy system. A specific embodiment can incorporate at least one energy harvesting module (H-module), where the H-module is adapted to interconnect with an energy storage module and/or a power electronic circuit module having complementary connectors. Further specific embodiments can incorporate at least one energy harvesting module (H-module) with at least one energy storage module (S-module) and/or at least one power electronic circuit module (C-module). The various modules can be integrated into a standard battery form factor. Specific embodiments pertain to a reconfigurable electrical energy system with modules that can be disconnected and reconnected, configured and reconfigured, into different shapes, configurations, and form factors.

BRIEF DESCRIPTION OF DRAWINGS

FIG. 4A shows a plurality of H-modules, S-modules, and C-modules configured to provide high storage capacity in accordance with an embodiment of the subject invention.

FIG. 4B shows a plurality of H-modules, S-modules, and C-modules configured to provide high energy harvesting capacity in accordance with an embodiment of the subject invention.

DETAILED DISCLOSURE

Figure 1:
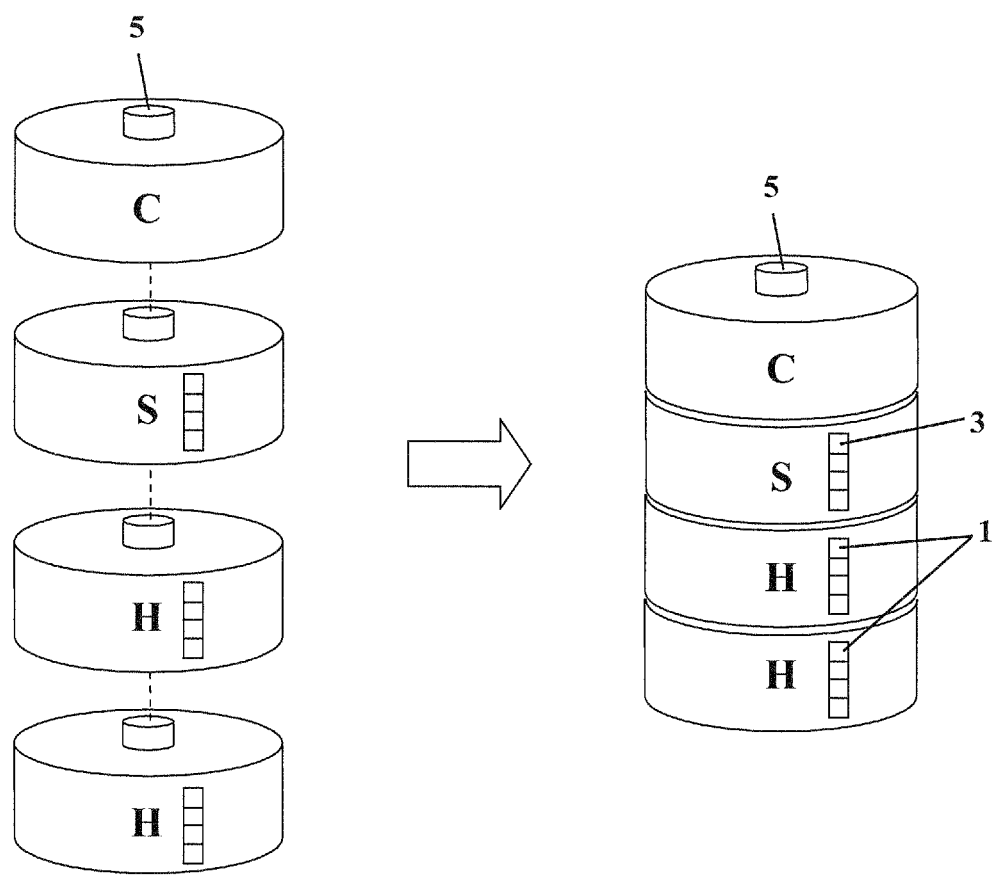
FIG. 1 shows two H-modules, one S-module, and one C-module connected linearly to form a standard AA battery form factor, where the H-modules and the S-module include bar-type LED indicators to indicate charge rate and charge capacity, respectively, in accordance with an embodiment of the subject invention.

Embodiments of the subject invention relate to a method and apparatus for providing an electrical energy system. Specific embodiments pertain to a reconfigurable electrical energy system with modules that can be disconnected and reconnected, configured and reconfigured, into different shapes, configurations, and form factors. Specific embodiments can be utilized with mobile electronic devices.

Specific embodiments can incorporate one or more energy harvesting modules (H-modules), where the H-module is adapted to interconnect with an energy storage module and/or a power electronic circuit module having complementary connectors. Further embodiments can incorporate one or more energy harvesting modules (H-modules) with one or more energy storage modules (S-modules) and/or one or more power electronic circuit modules (C-modules). Specific configurations can then be integrated into a battery form factor. In a specific embodiment, the one or more H-modules, one or more S-modules, and the one or more C-modules can be integrated into a standard battery form factor, such that the energy system has the same shape and electrical voltage output as that of a standard battery. Specific embodiments pertain to a reconfigurable energy system with modules that can be disconnected and reconnected into different shapes, configurations, and form factors.

In embodiments of the subject invention, H-modules can harvest energy from one or more available energy sources, such as vibrational/motion, thermal, solar, electromagnetic, or other ambient sources of energy. In specific embodiments, vibrational/motion H-modules can utilize, for example, piezoelectric, electrodynamic, magnetic, electrostatic, magnetoelastic, and/or other electromechanical energy transduction mechanisms to harvest vibrational/motion energy. Thermal H-modules can utilize, for example, thermoelectric, thermonic, and/or other thermal-electric energy transduction mechanisms to harvest thermal energy. Solar H-modules can utilize, for example, photoelectric and/or other radiation-based energy transduction mechanisms to harvest solar energy, and electromagnetic H-modules can utilize magnetic induction and/or other wireless power transfer mechanisms to harvest electromagnetic energy.

In embodiments of the subject invention, S-modules can store energy via batteries, super capacitors, and/or other energy storage mechanisms. The S-modules can then deliver the stored energy to external circuits or other destinations. In specific embodiments, an S-module can be based on a rechargeable electrochemical battery technology, such as Lithium ion, nickel metal hydride, or alkaline battery; a supercapacitor; a mechanical energy storage mechanism, such as a spring, flexure, or flywheel; or a magnetic energy storage mechanism.

In embodiments of the subject invention, C-modules can provide circuit functionality, provide external connectivity between multiple energy systems through the use of electrical terminals, and/or provide external circuitry. In specific embodiments, a C-module may provide, for example, one or more of the following circuit functionalities: ac-dc rectification, dc-ac inversion, power regulation, voltage amplification, current amplification, charging control, power delivery, sleep/standby control, short-circuit protection, or overvoltage protection. A C-module (power electronic circuit module) can include a wireless circuit, such as Bluetooth or ZigBee, that enables external communication of the energy system status. Examples of status indications include the level of battery charge, drain rate, and other diagnostic and state information. Energy systems in accordance with embodiments of the invention can be especially useful with the charge level monitoring of Lithium ion and other high density batteries. Recent government studies have indicated undercharging or overcharging Lithium ion batteries and other high energy density batteries can result in excessive heat and possible explosions. The reconfigurable energy systems in accordance with embodiments of the invention can have built in monitoring and communication capability to regulate and notify the user if the battery is malfunctioning or to disable battery cells in order to prevent a chain reaction.

In embodiments of the subject invention, the one or more H-modules, the one or more S-modules, and the one or more C-modules making up an energy system may take the shape and form of any standard AAAA, AAA, AA, C, D, 9-Volt, lantern battery, or any other battery form factor, such as the slim form factors found in portable electronics. An energy system in accordance with an embodiment of the subject invention can also deliver power to external electronic circuits at the same rate and duty cycle as a standard battery.

To allow flexibility in tailoring an energy harvesting system for a specific product and/or specific user profiles, embodiments pertain to a reconfigurable system, where individual modules (H-modules, S-modules, C-modules) can be connected to one another to create a functional energy harvesting and power delivery system. Accordingly, while the external form factor and electrical terminals of multiple electrical energy systems may appear similar, similar looking electrical energy systems may have very different internal functionality. A first electrical energy system may have more energy harvesting capability whereas a second electrical energy system, having the same exterior form factor and electrical connectors, may have more storage capability. One electrical energy system may be tailored to harvest energy from only one source, e.g., solar, whereas another electrical energy system may have a multiplicity of energy harvesting modules to collect energy from multiple energy sources, e.g., solar, vibrational, and thermal.

Manufacturing many smaller modules that can be interconnected to achieve different system size and performance is more efficient than manufacturing many different larger customized energy harvesting systems. The ability to reconfigure different modules can provide one or more of the following: large number of possible configurations, sizes, shapes, and functionality; combining different energy harvester technologies (e.g., solar, thermal, vibrational) to create a multi-mode energy harvesting system; ability to combine different power electronic modules for different power management functions, such as ac/dc rectification, and/or voltage/current regulation; ability to combine different energy storage mechanisms, such as traditional capacitors, super capacitors, and electrochemical batteries, and also mechanical energy storage devices, such as flexures and flywheels; allows the use of similar energy harvesting devices that are optimized for different input energy ranges, e.g., different vibrational energy harvesters, each tuned to a different frequency range so as to capture a broad frequency band of vibrational energy; and allows the orientation of different modules in different directions, e.g., for vibrational harvesters that respond in only one axial direction, three different harvesters could be used oriented orthogonal to one another to enable vibrational energy harvesting in all three dimensions. Accordingly, specific embodiments pertain to a set of n modules where various permutations of the n modules can be used to create energy systems having m modules, where m<n.

In further specific embodiments, the one or more H-modules, the one or more S-modules, and the one or more C-modules can be combined in a customized configuration to tailor the energy system for greater storage capacity through adding more S-modules to the energy system, as shown in FIG. 4A, or to tailor the energy system for greater energy harvesting ability through adding more H-modules to the energy system, as shown in FIG. 4B.

In still further specific embodiments, each H-module, S-module, and C-module can operate independently of one or more of the other modules, or alternatively, one or more H-module, S-module, and C-module can operate in conjunction with one or more of the other modules to provide information, such as charging rate and charge state. Such information can be provided in a manner known in the art, such as how smart batteries typically found in camera batteries provide similar information.

In yet further specific embodiments, each H-module, S-module, and C-module can also have paired male and female connectors that can allow the modules to be interconnected to one or more other modules, such as adjacent modules, as needed. These modules can then be connected, for example, in a linear array, a 2-D array, or a 3-D array. The connection between modules may be made, for example, through a "snapping" action, such as an action similar to how LEGOS™ connect, or other connecting action. In addition, the connectors used between modules may have electrical and mechanical functionality. Electrical functionality may provide paths for electrical power transfer, and/or network communications. In specific embodiments, one or more of the H-modules, S-modules, and C-modules can communicate with one or more other modules via network connectivity and network protocols. This network may provide overall status monitoring and/or permit the energy system to adaptively control modules depending on available energy sources and load demands.

In yet further specific embodiments, one or more H-module, S-module, and C-module may possess electrical terminals for connection of the energy system to external electronic circuits. One or more modules may provide visual charge rate/capacity or other functional status either visually, for example, via LED indicators, and/or by electronically encoding the functional status on the electrical terminals.

FIG. 1 shows two H-modules, one S-module, and one C-module connected linearly to form a standard AA battery form factor, wherein the H-modules and the S-module include bar-type LED indicators. Visual status indicators, such as activity indicator 1 located on the H-module, which indicates charge rates, and charge indicator 3 on the S-module, which indicates charge capacity, can be incorporated. Visual status indicators can utilize a variety of mechanisms, such as one or more LED's and/or OLED's. Visual indicators can be located on any of the modules and can be used to indicate the S-module charge level, C-module communicating status, such as connected and/or sending/receiving, with respect to neighboring, or other, H and S-modules and/or with respect to a main control system, such as an automobile main computer. C-module communications can utilize wireless, Bluetooth, Zigbee, or other communication protocols. Visual indicators can also be used to indicate whether the H-module is charging; whether H, C, and/or S-modules are operating properly; whether a H, C, and/or S-module has a fault; whether an H, C, and/or S-module has a fault and is automatically bypassed; whether an H, C, and/or S-module has a critical fault and needs to be replaced.

An electrical terminal 5 is also shown on each module in FIG. 1. The housing of each module can be made from a variety of materials, such as plastics, metals, and wood. In a specific embodiment, all the modules are the same size and shape, and in other embodiments, the modules can have a variety of shapes and sizes.

Figure 2:
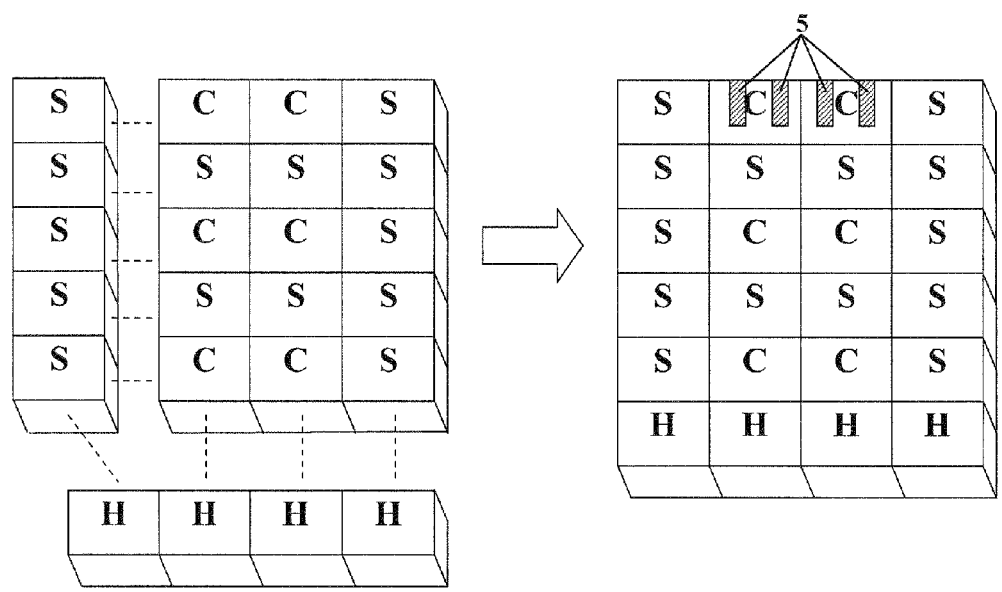
FIG. 2 shows a plurality of H-modules, S-modules, and C-modules interconnected in a 2-D array to form a low-profile portable electronic battery form factor in accordance with an embodiment of the subject invention.
Figure 3:
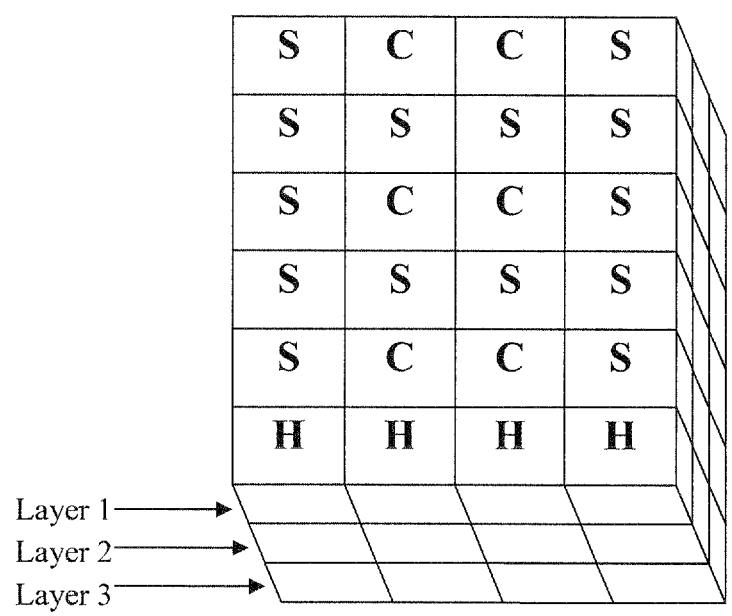
FIG. 3 shows a plurality of H-modules, S-modules, and C-modules interconnected in a 3-D array in accordance with an embodiment of the subject invention.

FIG. 2 shows a plurality of H-modules, S-modules, and C-modules interconnected in a 2-D array to form a low-profile portable electronic battery form factor, and FIG. 3 shows a plurality of H-modules, S-modules, and C-modules interconnected in a 3-D array, where the array is made up of three 2-D arrays from FIG. 2, in accordance with an embodiment of the subject invention. In an embodiment, such as the 3-D array embodiment, different H-modules can capture vibrational energy from a different direction or capture solar, or magnetic energy from a different direction, such that the energy system can harvest energy from many or all directions independent of the orientation of the energy system.

FIG. 4A shows a plurality of H-modules, S-modules, and C-modules configured to provide higher storage capacity, while FIG. 4B shows a plurality of H-modules, S-modules, and C-modules configured to provide higher energy harvesting capacity in accordance with an embodiment of the subject invention.

Reconfigurable batteries can be integrated into the physical structure or housing of a product. In a specific embodiment, the part can also be the H, C, or S module. One example is a component of an electric car, where the car part acts as a part of the car body and is also an H, C, or S module or combination thereof. Interconnects can be snapable male/female parts of traditional batteries or they can be other types of interconnects, such as connecting one part of a car to another when the energy system also acts as a part of the car.

Reconfigurable components can be swapped and replaced by module. For example, the S-module can be replaced when its useful life has been exhausted while the remaining modules can continue to operate. Each module can be "hot swappable", such that one module can be replaced while not having to shut down the full energy system. This is especially useful on 2D and 3D reconfigurable energy storage systems.

Specific embodiments using multiple C-modules, such as large energy system arrays, can have one or more of the C-modules arbitrate using a communications protocol, such as a peer-to-peer, client/server, and/or token-ring, to establish which C-module is the host (server) and which C-modules will act in a slave relation in communicating overall status of the energy system to the main control system, such as an automobile main computer.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

The invention claimed is:

1. An apparatus, comprising:
at least one energy harvesting module (H-module), wherein each H-module of the at least one H-module has an H form factor, wherein each H-module of the at least one H-module is configured to harvest energy from one or more energy sources; and
at least one energy storage module (S-module), wherein each S-module of the at least one S-module has an S form factor, wherein each S-module of the at least one S-module is configured to store energy,
wherein each H-module of the at least one H-module is configured to electrically interconnect with one or more of the at least one S-module such that when the each H-module of the at least one H-module is electrically interconnected to one or more S-modules of the at least one S-module the one or more of the at least one S-module electrically interconnected to the each H-module of the at least one H-module receives and stores the energy harvested by the each H-module of the at least one H-module,
wherein each H-module of the at least one H-module is configured to mechanically interconnect with each S-module of the at least one S-module such that when the each H-module of the at least one H-module is mechanically interconnected to the each S-module of the at least one S-module, the mechanical interconnection of the each H-module of the at least one H-module and the each S-module of the at least one S-module forms a H-S module combination such that the H-S module combination has an H-S form factor that is a combination of the H form factor and the S form factor,
wherein a first H-module of the at least one H-module is electrically interconnected with a first S-module of the at least one S-module, wherein the first H-module is mechanically interconnected with the first S-module to form a first H-S module combination having the H-S form factor.

2. An apparatus comprising:
at least one energy harvesting module (H-module), wherein each H-module of the at least one H-module has an H form factor, wherein each H-module of the at least one H-module harvests energy from one or more energy sources; and
at least one power electronic circuit module (C-module), wherein each C-module of the at least one C-module has a C form factor, wherein each C-module provides one or more of the following: circuit functionality, external connectivity to a second apparatus, and external connectivity to external circuitry,
wherein each H-module of the at least one H-module is configured to electrically interconnect with one or more of the at least one C-module such that when the each H-module of the at least one H-module is electrically interconnected to one or more C-modules of the at least one C-module, the one or more of the following: circuit functionality, external connectivity to a second apparatus, and external connectivity to external circuitry is provided by the one or more of the at least one C-module with respect to the energy harvested by the each H-module of the at least one H-module and/or the energy stored by the each S-module of the at least one S-module, wherein each H-module of the at least one H-module is configured to mechanically interconnect with each C-module of the at least one C-module such that when the each H-module of the at least one H-module is mechanically interconnected to the each C-module of the at least one C-module, the mechanical interconnection of the each H-module of the at least one H-module and the each C-module of the at least one C-module forms an H-C module combination such that the H-C module combination has an H-C form factor that is a combination of the H form factor and the C form factor, wherein a first H-module of the at least one H-module is electrically interconnected with a first C-module of the at least one C-module, wherein the first H-module is mechanically interconnected with the first C-module to form a first H-C module combination having the H-C form factor.

3. The apparatus according to claim 1, wherein each H-module of the at least one H-module comprises a first one or more connectors, wherein each S-module of the at least one S-module comprises a second one or more connectors, wherein the second one or more connectors are complementary to the first one or more connectors such that the first one or more connectors of the each H-module of the at least one H-module are configured to mechanically interconnect with a corresponding second one or more connectors of the each S-module of the at least one S-module such that the each H-module of the at least one H-module is mechanically interconnected with the each S-module of the at least one S-module to form the H-S combination.

4. The apparatus according to claim 2, wherein each H-module of the at least one H-module comprises a first one or more connectors, wherein each C-module of the at least one C-module comprises a second one or more connectors, wherein the second one or more connectors are complementary to the first one or more connectors such that the first one or more connectors of the each H-module of the at least one H-module are configured to mechanically interconnect with a corresponding second one or more connectors of the each C-module of the at least one C-module such that the each H-module of the at least one H-module is mechanically interconnected with the each C-module of the at least one C-module to form the H-C combination.

5. The apparatus according to claim 1, wherein each S-module of the at least one S-module comprises a first one or more connectors such that the first one or more connectors of the each S-module of the at least one S-module are configured to mechanically interconnect with a corresponding second one or more connectors of another S-module of the at least one S-module such that the each S-module is mechanically interconnected with the another S-module of the at least one S-module to form an S-S combination having an S-S form factor that is a combination of the S form factor and another S form factor.

6. The apparatus according to claim 2, wherein each C-module of the at least one C-module comprises a first one or more connectors such that the first one or more connectors of the each C-module of the at least one C-module are configured to mechanically interconnect with a corresponding second one or more connectors of another C-module of the at least one C-module such that the each C-module is mechanically interconnected with the another C-module of the at least one S-module to form a C-C combination having a C-C form factor that is a combination of the C form factor and another C form factor.

7. The apparatus according to claim 1, further comprising at least one power electronic circuit module (C-module), wherein each C-module of the at least one C-module provides one or more of the following: circuit functionality, external connectivity to a second apparatus, and external connectivity to external circuitry, wherein each S-module of the at least one S-module is configured to electrically interconnect with one or more of the at least one C-module such that when the each S-module of the at least one S-module is electrically interconnected to one or more C-modules of the at least one C-module, the one or more of the following: circuit functionality, external connectivity to a second apparatus, and external connectivity to external circuitry is provided by the one or more of the at least one C-module with respect to the energy harvested by the each S-module of the at least one S-module and/or the energy stored by the each S-module of the at least one S-module, wherein each S-module of the at least one S-module is configured to mechanically interconnect with each C-module of the at least one C-module such that when the each S-module of the at least one S-module is mechanically interconnected to the each C-module of the at least one C-module, the mechanical interconnection of the each S-module of the at least one S-module and the each C-module of the at least one C-module forms an S-C module combination such that the S-C module combination has an S-C form factor that is a combination of the S form factor and the C form factor, wherein a first S-module of the at least one S-module is electrically interconnected with a first C-module of the at least one C-module, wherein the first S-module is mechanically interconnected with the first C-module to form a first S-C module combination having the S-C form factor.

8. The apparatus according to claim 7, wherein each S-module of the at least one S-module comprises a first one or more connectors, wherein each C-module of the at least one C-module comprises a second one or more connectors, wherein the second one or more connectors are complementary to the first one or more connectors such that the first one or more connectors of the each S-module of the at least one S-module are configured to mechanically interconnect with a corresponding second one or more connectors of the each C-module of the at least one C-module such that the each S-module of the at least one S-module is mechanically interconnected with the each C-module of the at least one C-module to form the S-C combination.

9. The apparatus according to claim 1, wherein one or more of the at least one H-module harvests vibrational energy.

10. The apparatus according to claim 2, wherein one or more of the at least one H-module harvests vibrational energy.

11. The apparatus according to claim 9, wherein the one or more H-module that harvests vibrational energy harvests the vibrational energy via one or more transduction mechanisms selected from the group consisting of: piezoelectric, electrodynamic, magnetic, electrostatic, and magnetoelastic.

12. The apparatus according to claim 10, wherein the one or more H-module that harvests vibrational energy harvests the vibrational energy via one or more transduction mechanisms selected from the group consisting of: piezoelectric, electrodynamic, magnetic, electrostatic, and magnetoelastic.

13. The apparatus according to claim 1, wherein the one or more of the at least one H-module harvests thermal energy.

14. The apparatus according to claim 2, wherein the one or more of the at least one H-module harvests thermal energy.

15. The apparatus according to claim 13, wherein the one or more H-module that harvests thermal energy via a thermal-electric energy transduction mechanism selected from the group consisting of thermoelectric and thermonic.

16. The apparatus according to claim 14, wherein the one or more H-module that harvests thermal energy via a thermal-electric energy transduction mechanism selected from the group consisting of thermoelectric and themionic.

17. The apparatus according to claim 1, wherein one or more of the at least one H-module harvests solar energy.

18. The apparatus according to claim 2, wherein one or more of the at least one H-module harvests solar energy.

19. The apparatus according to claim 17, wherein the one or more H-module that harvests solar energy harvests the solar energy via a photoelectric energy transduction mechanism.

20. The apparatus according to claim 18, wherein the one or more H-module that harvests solar energy harvests the solar energy via a photoelectric energy transduction mechanism.

21. The apparatus according to claim 1, wherein one or more of the at least one H-module harvests electromagnetic energy.

22. The apparatus according to claim 2, wherein one or more of the at least one H-module harvests electromagnetic energy.

23. The apparatus according to claim 21, wherein the one or more H-module that harvests electromagnetic energy harvests the electromagnetic energy via magnetic induction.

24. The apparatus according to claim 22, wherein the one or more H-module that harvests electromagnetic energy harvests the electromagnetic energy via magnetic induction.

25. The apparatus according to claim 1, wherein one or more of the at least one S-module comprises a rechargeable electrochemical battery.

26. The apparatus according to claim 1, wherein one or more of the at least one S-module comprises a supercapacitor.

27. The apparatus according to claim 2, wherein one or more of the at least one S-module comprises a mechanical energy storage mechanism.

28. The apparatus according to claim 2, wherein one or more of the at least one S-module comprises a magnetic energy storage mechanism.

29. The apparatus according to claim 2, wherein one or more of the at least one C-module provides ac-dc rectification.

30. The apparatus according to claim 2, wherein one or more of the at least one C-module provides dc-ac inversion.

31. The apparatus according to claim 2, wherein one or more of the at least one C-module provides power regulation.

32. The apparatus according to claim 2, wherein one or more of the at least one C-module provides voltage amplification.

33. The apparatus according to claim 2, wherein one or more of the at least one C-module provides current amplification.

34. The apparatus according to claim 2, wherein one or more of the at least one C-module provides charging control.

35. The apparatus according to claim 2, wherein one or more of the at least one C-module provides power delivery.

36. The apparatus according to claim 2, wherein one or more of the at least one C-module provides sleep/standby control.

37. The apparatus according to claim 2, wherein one or more of the at least one C-module provides short-circuit protection.

38. The apparatus according to claim 2, wherein one or more of the at least one C-module provides overvoltage protection.

39. The apparatus according to claim 7, wherein the apparatus delivers power to external electronic circuits at the same rate and duty cycle as a battery selected from the group consisting of a AAAA battery, a AAA battery, a AA battery, a C battery, a D battery, a 9-Volt battery and a lantern battery.

40. The apparatus according to claim 7, wherein one or more of the at least one H-module, at least one S-module, and at least one C-module operates independently of the remaining modules.

41. The apparatus according to claim 7, wherein one or more of the at least one H-module, at least one S-module, and at least one C-module operates in conjunction with at least one of the remaining modules.

42. The apparatus according to claim 7, wherein one or more of the at least one H-module, at least one S-module, and at least one C-module comprise a paired male and female connectors.

43. The apparatus according to claim 42, wherein the paired male and female connectors provide a path for electrical power transfer.

44. The apparatus according to claim 42, wherein the paired male and female connectors provide a path for network communication.

45. The apparatus according to claim 44, wherein the network communication provides overall status monitoring.

46. The apparatus according to claim 44, wherein the network communication allows the apparatus to adaptively control one or more of the at least one H-module, at least one S-module, and at least one C-module.

47. The apparatus according to claim 7, wherein the at least one H-module, the at least one S-module, and the at least one C-module are arranged in a linear array.

48. The apparatus according to claim 7, wherein the at least one H-module, the at least one S-module, and the at least one C-module are arranged in a 2-D array.

49. The apparatus according to claim 7, wherein the at least one H-module, the at least one S-module, and the at least one C-module are arranged in a 3-D array.

50. The apparatus according to claim 7, wherein the connection between the at least one H-module, the at least one S-module, and the at least one C-module comprises a snapping action.

* * * * *